United States Patent
Lyons et al.

(10) Patent No.: US 7,099,638 B2
(45) Date of Patent: Aug. 29, 2006

(54) METHOD AND APPARATUS FOR RECEIVING AN AMPLITUDE MODULATED RADIO SIGNAL

(75) Inventors: Patrick J Lyons, Trastenagh (IE); Jeremy J Greenwood, West Midlands (GB)

(73) Assignees: Hi-Key Limited, Galway (IE); Land Rover, Warwick (GB)

( * ) Notice: Subject to any disclaimer, the term of this patent is extended or adjusted under 35 U.S.C. 154(b) by 337 days.

(21) Appl. No.: 10/451,069

(22) PCT Filed: Dec. 20, 2001

(86) PCT No.: PCT/IE01/00161

§ 371 (c)(1), (2), (4) Date: Jun. 20, 2003

(87) PCT Pub. No.: WO02/49888

PCT Pub. Date: Jun. 27, 2002

(65) Prior Publication Data

US 2004/0041692 A1    Mar. 4, 2004

(30) Foreign Application Priority Data

Dec. 20, 2000 (IE) ............................. S2000/1054

(51) Int. Cl.
*H04B 1/14* (2006.01)

(52) U.S. Cl. ............................. 455/166.1; 455/161.1; 455/296

(58) Field of Classification Search .. 455/160.1–168.1, 455/296; 375/136, 137, 147–153
See application file for complete search history.

(56) References Cited

U.S. PATENT DOCUMENTS 4,903,328 A * 2/1990 Ichikawa ................. 455/165.1

(Continued)

FOREIGN PATENT DOCUMENTS

EP    0 926 021 A    6/1999

(Continued)

*Primary Examiner*—Nguyen T. Vo
*Assistant Examiner*—Adeel Haroon
(74) *Attorney, Agent, or Firm*—Sughrue Mion, PLLC (57) ABSTRACT

Receiving apparatus (1) for receiving an amplitude modulated signal which may be transmitted on a plurality of frequency channels within a predetermined frequency bandwidth comprises a tuner (3) for sequentially scanning through the channels under the control of a microprocessor (6) which determines the presence of a signal on a channel to which the tuner (3) is tuned. A first validation circuit (10) determines if the received signal is a valid type signal, and if so the microprocessor (6) counts the channels from the channel on which the signal is first detected to the channel on which the signal can no longer be detected is reached. The microprocessor (6) determines the middle one of the channels in which the signal is detected, and the microprocessor (6) locks the tuner (3) onto the frequency of the middle channel, and simultaneously operates a gate circuit (11) for outputting at least one complete signal to security apparatus of a motor vehicle for switching the state of the security apparatus from one of an armed and a disarmed state to the other of the armed and disarmed state. A noise suppressing circuit (9) is responsive to a noise analyzing circuit (8) under the control of the microprocessor (6) for suppressing noise in the received signal.

24 Claims, 4 Drawing Sheets

U.S. PATENT DOCUMENTS

| | | | |
|---|---|---|---|
| 5,161,168 A * | 11/1992 | Schilling | 370/342 |
| 5,587,715 A * | 12/1996 | Lewis | 342/357.03 |
| 5,621,767 A * | 4/1997 | Brandt et al. | 375/344 |
| 6,173,166 B1 * | 1/2001 | Whitecar | 455/296 |
| 6,560,270 B1 * | 5/2003 | Hischke | 375/136 |
| 6,804,262 B1 * | 10/2004 | Vogel et al. | 370/480 |

FOREIGN PATENT DOCUMENTS

WO     WO 00 38320 A     6/2000

* cited by examiner

METHOD AND APPARATUS FOR RECEIVING AN AMPLITUDE MODULATED RADIO SIGNAL

This is a National Stage Entry of Application No. PCT/IE01/00161 filed Dec. 20, 2001; the disclosure of which is incorporated herein by reference.

BACKGROUND OF THE INVENTION

The present invention relates to a method and apparatus for receiving an amplitude modulated (AM) radio signal, and in particular, for receiving an AM radio signal which may be transmitted in any one of a plurality of frequency channels within a predetermined frequency bandwidth.

Vehicle security apparatus is commonly operated remotely by a radio signal, which typically is transmitted by a hand-held transmitter. Such transmitters, are relatively small and are suitable for mounting on a key ring, and typically, are referred to as key fob transmitters. Alternatively, the transmitter may be contained in the head of a key. Such security apparatus typically comprises a central control circuit which receives the radio signal from the transmitter through a radio receiver associated with the central control circuit. Signals received by the radio receiver are analysed in the central control circuit to ascertain if a signal is a valid signal. On reception of a valid signal the central control circuit changes the state of the security apparatus. For example, the central control circuit may control a vehicle immobiliser for immobilising the vehicle, the central locking system for locking the doors of the vehicle, a vehicle alarm and the like. Thus, if the security apparatus is in an armed state, whereby the immobiliser is in a state for immobilising the vehicle, the central locking system is in a state with the doors locked, and the alarm circuit is armed for detecting unauthorised entry or an attempted unauthorised entry to the vehicle, on reception of a valid signal the central control circuit disarms the security apparatus thereby operating the central locking system for unlocking the doors, operating the immobiliser to allow the vehicle to be mobilised, and for disarming the alarm circuit. On the security apparatus being in the disarmed state, a valid signal received by the radio receiver causes the central control circuit to arm the security apparatus.

Typically, the remote transmitter in each transmission transmits a series of encoded signals, each of which comprises a preamble code which is common to a particular type of security apparatus, and an ID code which is specific and unique to the specific security apparatus which is to receive the signal. Typically, one to five complete signals are transmitted in each series.

It is not unusual to encounter areas in which certain frequency channels in which the signal is to be transmitted contain a relatively high amount of noise. To avoid such noisy channels it is desirable that the channel frequency at which a signal from a remote transmitter is being transmitted is varied from transmission to transmission. Additionally, it is desirable to vary the channel frequency at which the transmissions are made from transmission to transmission to minimise the danger of a signal which is transmitted by the remote transmitter being picked up and retransmitted by an unauthorised person, for example, a car thief. The channel frequency at which the transmissions are made may be sequentially or randomly varied, but more typically, are randomly varied.

In cases where the signal being transmitted is a frequency modulated signal, in general, there is little difficulty in providing a radio receiver for locating in the vehicle which is readily capable of scanning the predetermined frequency bandwidth containing the channels in which the transmissions may be made, and then locking onto a frequency of the channel at which a signal has been detected. However, in many cases it is desirable that the signal transmitted by a remote transmitter should be an AM radio signal. Unfortunately, due to the lack of suitable scanning methods and apparatus for automatically scanning a frequency bandwidth for an AM signal, it has been necessary to set the transmitter and receiver of vehicle security apparatus to transmit and receive on one single fixed AM frequency. This is undesirable.

There is therefore a need for a method and apparatus for receiving an AM radio signal which may be transmitted in any one of a plurality of frequency channels within a predetermined frequency band.

SUMMARY OF THE INVENTION

The present invention is directed towards providing such a method and apparatus.

According to the invention there is provided a method for receiving an AM radio signal which may be transmitted in any one of a plurality of frequency channels within a predetermined frequency bandwidth, the method comprising operating a tuning means of a radio receiver to scan the channels of the predetermined frequency bandwidth for detecting a signal, wherein on detecting a signal in a frequency channel the tuning means is operated to scan a frequency bandwidth adjacent the channel in which the signal is detected for determining the number of channels in which the signal can be detected, and operating the tuning means at the frequency of a middle one of the channels in which the signal can be detected.

Preferably, the tuning means is locked onto the frequency of the middle one of the channels in which the signal can be detected for a period sufficient for allowing at least one complete signal to be received. Advantageously, the tuning means is locked onto the frequency of the middle one of the channels in which the signal can be detected for a predetermined time period.

In one embodiment of the invention the frequency bandwidths of the respective frequency channels are similar.

In another embodiment of the invention each time a signal is detected in a frequency channel in a scan the received signal is analysed for determining if the signal is of a valid type. Preferably, each received signal is analysed for determining if the signal is of a valid type format.

Ideally, the tuning means is operated for scanning the frequency channels within the predetermined frequency bandwidth sequentially from one end of the predetermined bandwidth to the other.

In one embodiment of the invention the tuning means is operated for scanning the frequency channels within the predetermined frequency bandwidth from the channel of lowest frequency to the channel of highest frequency.

Preferably, the tuning means is operated for scanning the predetermined frequency bandwidth by sequentially altering the scanned frequency in frequency steps. Advantageously, the frequency steps are of similar value. Ideally, the frequency bandwidth of each frequency step is similar to the frequency bandwidth of the respective frequency channels.

In one embodiment of the invention on detecting a signal in one of the frequency channels, the tuning means is operated to sequentially scan the channels from the channel in which the signal is first detected until a channel in which the signal can no longer be detected has been reached for determining the middle one of the channels in which the signal can be detected. Preferably, a count is recorded of the number of frequency channels through which the tuning means is stepped from the channel in which the signal is first detected to the channel in which the signal can no longer be detected has been reached for determining the middle one of the channels in which the signal can be detected. Advantageously, the number of frequency steps through which the tuning means is stepped after the channel in which the signal is first detected is limited to a predetermined number of steps.

In one embodiment of the invention the predetermined number of steps through which the tuning means is stepped after the channel in which the signal is first detected does not exceed ten steps. Preferably, the predetermined number of steps through which the tuning means is stepped after the channel in which the signal is first detected does not exceed seven steps. Preferably, the predetermined number of steps through which the tuning means is stepped after the channel in which the signal is first detected does not exceed five steps.

In one embodiment of the invention when the channel in which the signal can no longer be detected has been reached or the tuning means has been stepped through the predetermined number of steps from the channel in which the signal is first detected, the frequency at which the tuning means is operating is altered by approximately half the number of frequency steps through which the tuning means had been operated from the channel in which the signal is first detected.

In another embodiment of the invention the received signal in each frequency channel is passed through a variable level noise suppressing means, and the received signal from the noise suppressing means from each frequency channel is analysed for the presence of noise, and on noise being present in the signal, the level of suppression at which the noise suppressing means is being operated for the frequency channel to which the tuning means is tuned is incremented by one level up to a maximum predetermined number of suppression levels.

In a further embodiment of the invention when the noise suppressing means is being operated at the maximum level for the frequency channel to which the tuning means is tuned, and noise is still present in the signal from that channel, a flag means is set for that channel, and that channel is skipped on each scan of the frequency bandwidth for a predetermined number of scans.

In another embodiment of the invention on no noise being present in the signal from the noise suppressing means on the channel to which the tuning means is tuned, the suppression level at which the noise suppressing means is being operated is decremented by one suppression level for that channel until the suppression level at which the noise suppressing means is being operated for that channel is reduced to a zero level of suppression.

Preferably, each time the level of suppression of the noise suppressing means is altered for each channel, the new level of suppression to which the noise suppressing means has been altered is recorded.

In one embodiment of the invention each time noise is detected in a signal on a channel, that channel is assigned an integer of a first value which is summed to already assigned integers to that channel to determine a current integer value for that channel, and on the current integer value for any channel reaching one of a number of predetermined first current integer values which correspond to levels of suppression after an integer of the first value has been summed to the already assigned integers to that channel, the level of suppression at which the suppressing means is being operated for that channel is altered to the corresponding level of suppression.

In another embodiment of the invention each time no noise is detected in a signal on a channel, that channel is assigned an integer of a second value which is deducted from already assigned integers to that channel to determine a current integer value for that channel, and on the current integer value of any channel falling to one of a number of predetermined second current integer values which correspond to levels of suppression after an integer of the second value has been deducted from the already assigned integers to that channel, the level of suppression at which the suppressing means is being operated for that channel is altered to the corresponding level of suppression.

Preferably, the first value of the integer is greater than the second value of the integer for introducing a sufficient level of hysteresis for avoiding excessive cycling of the suppressing means between respective adjacent levels of suppression. Advantageously, the first current integer values are less than the second current integer values corresponding to each level of suppression for introducing a sufficient level of hysteresis for avoiding excessive cycling of the suppressing means between the respective adjacent levels of suppression.

Additionally the invention provides a receiving apparatus for receiving an amplitude modulated radio signal which may be transmitted in any one of a plurality of frequency channels within a predetermined frequency bandwidth, the apparatus comprising a receiving means for receiving the AM radio signal, a tuning means for sequentially tuning the receiving means to the plurality of frequency channels, a detecting means for detecting the presence of a signal, and a control means for controlling the tuning means for scanning the frequency bandwidth for detecting a signal in a frequency channel, wherein the control means is responsive to the detecting means detecting a signal in a frequency channel for controlling the tuning means to scan a frequency bandwidth adjacent the frequency channel in which the signal is detected for determining the number of channels in which the signal can be detected, and for further operating the tuning means at the frequency of a middle one of the channels in which the signal can be detected.

In one embodiment of the invention the control means locks the tuning means onto the frequency of the middle one of the channels in which the signal can be detected for a period sufficient for allowing at least one complete signal to be received. Preferably, the control means locks the tuning means onto the frequency of the middle one of the channels in which the signal can be detected for a predetermined time period.

In one embodiment of the invention a first signal analysing means is provided for analysing each received signal for determining if the signal is of a valid type. Preferably, the first signal analysing means analyses each received signal for determining if the signal is of a valid type format.

Preferably, the control means operates the tuning means for scanning the frequency channels of the predetermined frequency bandwidth sequentially from one end of the predetermined bandwidth to the other.

In one embodiment of the invention the control means operates the tuning means for scanning the frequency channels of the predetermined frequency bandwidth sequentially from the end of lowest frequency to the end of highest frequency.

In another embodiment of the invention the control means operates the tuning means for scanning the predetermined frequency bandwidth by sequentially altering the scanned frequency in respective frequency steps. Preferably, the control means operates the tuning means for scanning the predetermined frequency bandwidth by altering the scanned frequency in frequency steps of predetermined frequency. Advantageously, the control means operates the tuning means for scanning the predetermined frequency bandwidth in predetermined frequency steps of similar frequency bandwidth. Ideally, each frequency step corresponds to the frequency bandwidth of each channel.

In another embodiment of the invention the control means is responsive to the detecting means detecting a signal in one of the channels for operating the tuning means to sequentially scan the channels from the channel in which the signal is first detected until a channel in which the signal can no longer be detected has been reached for determining the middle one of the channels in which the signal can be detected.

In a further embodiment of the invention the control means stores a count of the number of channels through which the tuning means is stepped from the first channel in which a signal is detected to the channel in which the signal can no longer be detected has been reached. Preferably, the control means is responsive to the count of the number of channels in which the signal can be detected exceeding a predetermined number or to the channel in which the signal can no longer be detected being reached for altering the frequency at which the tuning means is operating to a frequency which is at least one frequency step towards the channel in which the signal is first detected for determining the middle one of the channels in which the signal can be detected.

In one embodiment of the invention a variable level noise suppressing means is provided for suppressing noise in the received signal under the control of the control means, the received signal on each frequency channel being passed through the noise suppressing means, and a noise analysing means being provided for analysing the received signal on each channel for noise after the signal has been passed through the noise suppressing means, the control means being responsive to the noise analysing means detecting the presence of noise in a channel to which the tuning means is tuned for incrementing the level of suppression at which the noise suppressing means is being operated by one level up to a maximum predetermined number of suppression levels.

In one embodiment of the invention the control means records the level of suppression at which the noise suppressing means is being operated for each channel in a storing means.

In another embodiment of the invention the control means is responsive to the noise suppressing means being operated at the maximum noise suppression level in a frequency channel to which the tuning means is tuned for setting a flag means for that channel, and the control means is responsive to a flag means being set for operating the tuning means for skipping any channel for which a flag means has been set for a predetermined number of scans.

In a further embodiment of the invention the control means is responsive to the noise analysing means failing to detect noise in the signal from a channel to which the tuning means is tuned for reducing the level of suppression to which the noise suppressing means is set for that channel by one level to a minimum of zero levels of suppression.

In one embodiment of the invention a gate means is provided which is responsive to a valid type signal being detected for gating the valid type signal from the apparatus.

In one embodiment of the invention the apparatus is adapted for use in a security apparatus of a motor vehicle, and a received valid type signal is gated to the security apparatus. Preferably, the apparatus is adapted for controlling an immobilising means for immobilising the vehicle. Advantageously, the apparatus is adapted for controlling a means for controlling a central locking system of the motor vehicle. Ideally, the apparatus is adapted for controlling an alarm circuit of the motor vehicle.

Additionally the invention provides security apparatus for a motor vehicle in which the security apparatus comprises the receiving apparatus according to the invention, and a second analysing means for analysing each valid type signal gated from the receiving apparatus for determining if the valid type signal is a valid signal for the security apparatus.

In one embodiment of the invention an immobilising means is provided for immobilising the vehicle, the immobilising means being responsive to a valid signal being received.

In another embodiment of the invention an alarm circuit is provided, and the alarm circuit is armed or disarmed in response to a valid signal being received.

In a further embodiment of the invention the security apparatus is responsive to a valid signal being received for operating a central locking system of the vehicle.

The advantages of the invention are many. A particularly important advantage of the invention is that the receiving apparatus according to the invention is particularly suitable for receiving AM radio signals which may be transmitted in any one of a plurality of frequency channels, which may be randomly selected or otherwise, within a predetermined frequency bandwidth. In particular, the receiving apparatus according to the invention receives the AM radio signal on the frequency channel in which the signal is strongest, in other words, the frequency channel on which the AM signal has been transmitted, or a channel adjacent to the frequency channel on which the AM radio signal has been transmitted. A further advantage of the invention is that the receiving apparatus is a relatively simple and inexpensive receiving apparatus.

A further advantage of the invention is achieved by providing the noise analysing means and the noise suppressing means, in that noise in the received signals in each channel can be readily easily suppressed. Another advantage of the invention is that when the receiving apparatus comprises the noise suppressing means operated with the first integer value weighted against the second integer value, and the second current integer value weighted against the first current integer value, excessive cycling of the suppressing means between adjacent levels of suppression is minimised.

BRIEF DESCRIPTION OF THE DRAWINGS

The invention will be more clearly understood from the following description of a preferred embodiment thereof which is given by way of example only with reference to the accompanying drawings in which.

DETAILED DESCRIPTION OF THE INVENTION

Figure 1:
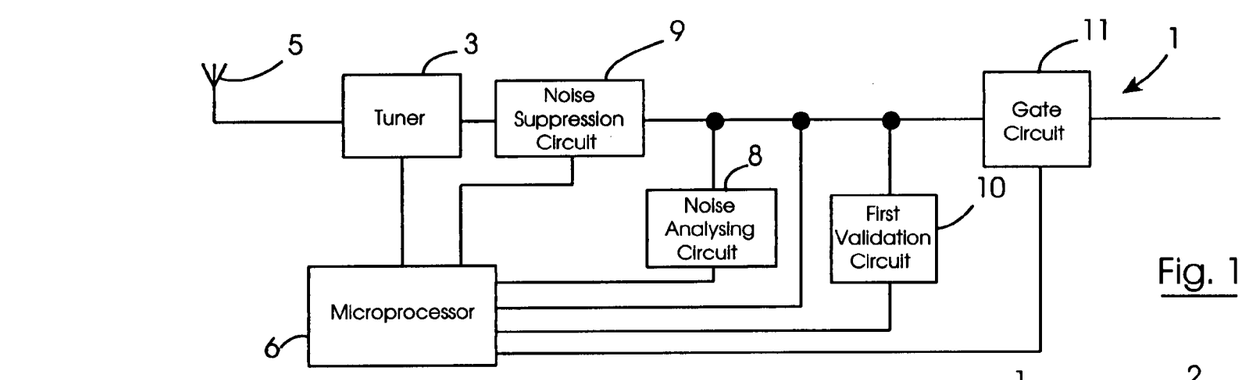
FIG. 1 is a block representation of receiving apparatus according to the invention for receiving an AM radio signal which may be transmitted in any one of a plurality of frequency channels within a predetermined frequency bandwidth.

Referring to the drawings and in particular to FIG. 1 there is illustrated receiving apparatus according to the invention indicated generally by the reference numeral 1 for receiving an AM radio signal which may be transmitted in any one of a plurality of frequency channels, either randomly selected or otherwise, within a predetermined frequency bandwidth. The apparatus 1 is particularly suitable for use with security apparatus also according to the invention and indicated generally by the reference numeral 2 in FIG. 2 for a motor vehicle. The apparatus of FIG. 2 will be described in detail below. The AM radio signal to which the apparatus 1 is adapted to receive is typically transmitted by a key fob transmitter (not shown) which is of relatively small size, and is typically suitable for attaching to a key ring, or located in the head of a motor vehicle ignition key. The transmitter (not shown) is of the type which has a facility for transmitting an encoded signal on any one of the plurality of frequency channels, and in this embodiment of the invention thirty-two frequency channels within the predetermined frequency bandwidth of 0.55 MHz between 433.65 MHz and 434.20 MHz, each frequency channel being of approximately 0.017 MHz bandwidth. Typically, the signal is an encoded signal and comprises a preamble followed immediately by a specific code. The preamble is such as to be common to many security systems of motor vehicles for allowing a rapid determination as to whether the received signal is a valid type signal, in other words, is of a valid format. The specific code is unique to one and only one receiving and security apparatus of one motor vehicle. Such signals will be well known to those skilled in the art. Typically, on each transmission a plurality of the signals are transmitted sequentially in relatively quick succession, and commonly, the number of complete signals transmitted in each transmission may be from one to five. This aspect of security apparatus for motor vehicles and signals and the transmission of such signals will be known to those skilled art.

Figure 5:
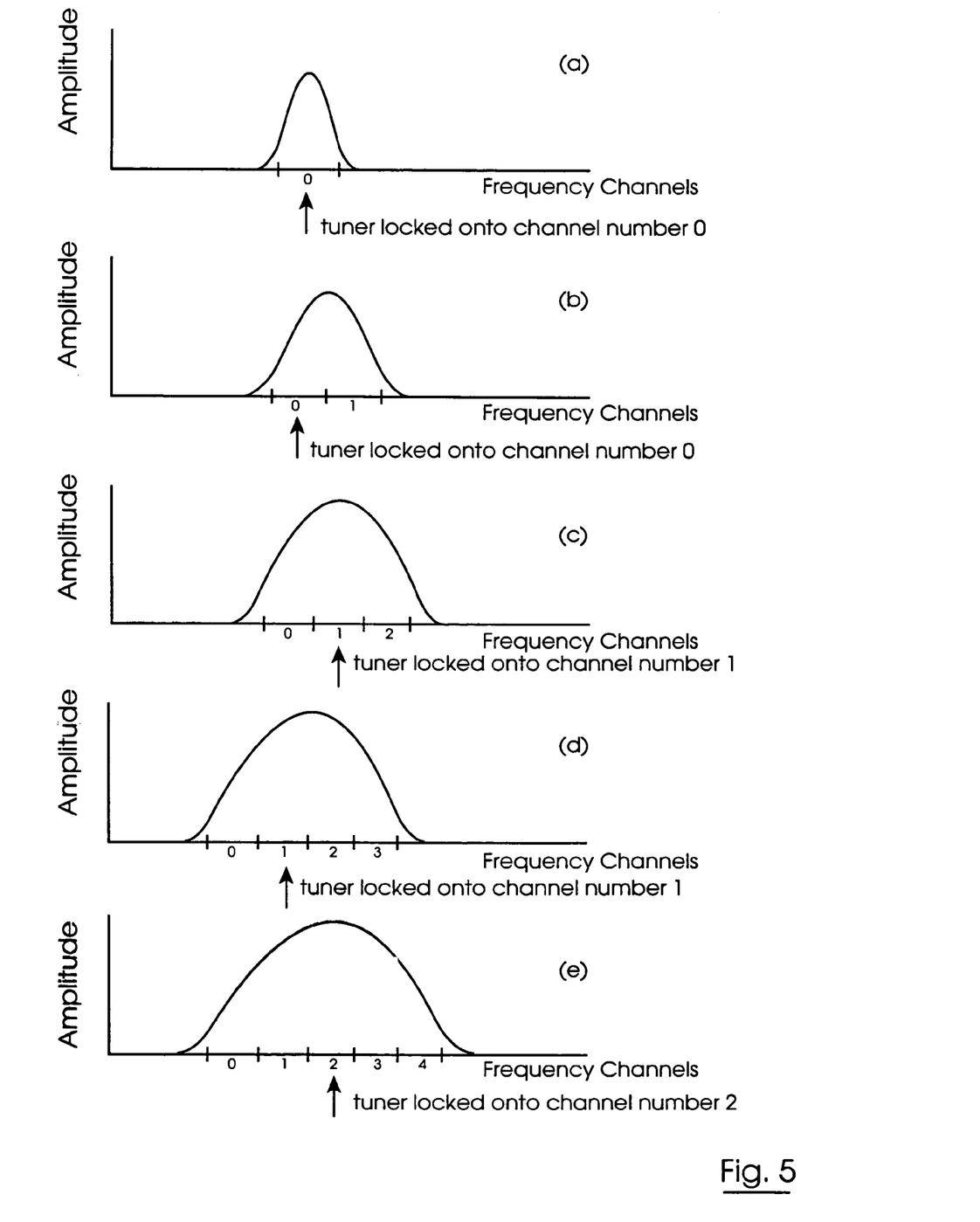

Being an AM radio signal the transmitted signal when received may straddle a number of frequency channels, and typically, may straddle up to five frequency channels, as, for example, can be seen from FIG. 5. Accordingly, the receiving apparatus 1 is operated for scanning the entire frequency bandwidth sequentially in incremental steps of frequency corresponding to the width of each frequency channel. The apparatus 1 scans the channels sequentially from the lowest frequency, namely, 433.65 MHz to the highest frequency 434.20 MHz, and then returns to the lowest frequency. Scanning is continued until a valid type signal, in other words, a signal of valid type format is received on one of the frequency channels. Once a signal of valid type format is received on one of the frequency channels sequential scanning continues of the frequency channels until the first of the channels in which the valid type signal can no longer be detected is reached. The receiving apparatus 1 is then operated to receive the valid type signal at a frequency of a middle one of the channels in which the valid type signal has been detected, or at a frequency of a channel adjacent the middle one of the channels in which the valid type signal has been detected, as will be described in detail below. In this way the signal is received in the channel in which the signal is strongest.

Turning now to the receiving apparatus 1, the receiving apparatus 1 comprises a tuner, namely, a tuner 3 which receives radio signals from an aerial 5. The tuner 3 is operated under the control of a control means, namely, a microprocessor 6 for stepping the tuner 3 through the predetermined frequency bandwidth of 0.55 MHz from the lowest frequency of 433.65 MHz to the highest frequency 434.20 MHz through thirty-two incremental steps each of approximately 0.017 MHz for scanning the thirty-two channels on which the AM radio signal may be transmitted.

A noise analysing means, namely, a noise analysing circuit 8 is provided to ascertain if the channel to which the tuner 3 is tuned contains noise. The output of the noise analysing circuit 8 is read by the microprocessor 6, which if noise is detected operates a variable level noise suppressing means, namely, a variable level noise suppression circuit 9. The noise suppression circuit 9 is operable at four levels of noise suppression for correspondingly reducing the sensitivity at which signals are received on the respective channels by the apparatus 1, for in turn reducing the level of noise in the received signal received on the respective channels. The microprocessor 6 operates the noise suppression circuit 9 at the respective noise suppression levels for reducing the sensitivity of the apparatus 1 in decremental steps for each channel until noise has been substantially eliminated from the signal received in those channels in which noise is detected, and the received signal can be deciphered. In the event that the noise suppression circuit 9 is operating at its maximum level of noise suppression in any of the channels, and the noise is still present in that channel, the microprocessor sets a flag means, namely, a jump flag for that channel which causes the tuner 3 to skip that channel during subsequent scans of the frequency band as will be described below.

The microprocessor 6 under the control of suitable software reads the output of the noise suppression circuit 9, and acts as a detecting means for detecting the presence of a signal on the channel to which the tuner 3 is tuned.

A first signal analysing means comprising a first validation circuit 10 reads and analyses the signal from the noise suppression circuit 9 to ascertain if the signal is of a valid type. The first validation circuit 10 compares the preamble of the received signal with a stored reference preamble to ascertain if the signal is of valid type and of valid format. On detecting the presence of a signal the microprocessor 6 reads the output from the first validation circuit 10, and on a valid type signal being received the microprocessor 6 records the channel in which the valid type signal has been received. The microprocessor 6 then operates the tuner 3 to continue to step through the channels until a channel is reached in which the valid type signal can no longer be detected, and a count is made of the number of channels through which the tuner 3 is stepped. The microprocessor 6 as will be described below determines from the count of the channels the middle channel of the channels in which the valid signal has been detected, and locks the tuner onto the frequency of the middle channel. Simultaneously, the microprocessor 6 operates a gate circuit 11 for outputting the signal to the security apparatus 2 for further analysis. The microprocessor 6 locks the tuner 6 onto the middle channel frequency and holds the gate circuit 11 open for a predetermined time period sufficient to output at least one complete signal to the security apparatus 2, which in this embodiment of the invention is approximately 100 milliseconds. Each time the tuner 3 is incremented to the next channel the signal is analysed by the noise analysing circuit 8 and the first validation circuit 10.

Figure 2:
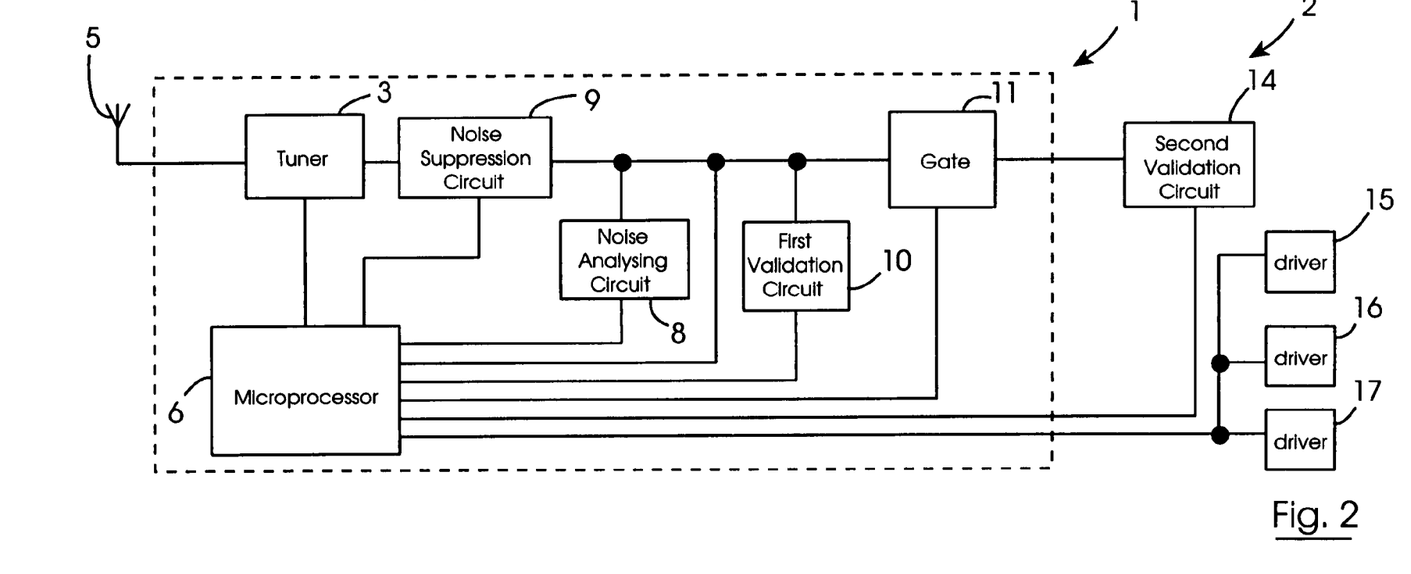
FIG. 2 is a block representation of security apparatus for securing a motor vehicle which incorporates the receiving apparatus of FIG. 1.

Turning now to FIG. 2 the security apparatus 2 incorporates the receiving apparatus 1 and shares the microprocessor 6 with the receiving apparatus 1 the security apparatus 2 comprises a second signal analysing means, namely, a second validation circuit 14 for validating the signal received through the gate circuit 11 as being a valid signal for the security apparatus 2 or otherwise. The second validation circuit 14 compares one complete signal received through the gate circuit 11 with a stored reference signal to again determine if the signal is of valid type format, and then if the code following the preamble is identical to a reference code of the stored reference signal. The microprocessor 6 reads the output from the second validation circuit 14, and on the signal being determined as being a valid signal for the security apparatus 2 the microprocessor 6 operates drivers 15, 16 and 17 for changing the state of a vehicle immobiliser in the vehicle, the central locking system of the motor vehicle and an alarm circuit of the motor vehicle, respectively, none of which are illustrated, but will be well known to those skilled in the art. Thus, if the vehicle immobiliser, the central locking system and the alarm circuit are in the armed state, in other words, with the vehicle immobilised, locked and the alarm circuit armed, reception of a valid signal causes the microprocessor 6 to operate the drivers 15, 16 and 17 for disarming the vehicle immobiliser, the central locking system and the alarm circuit, and vice versa.

Figure 3:
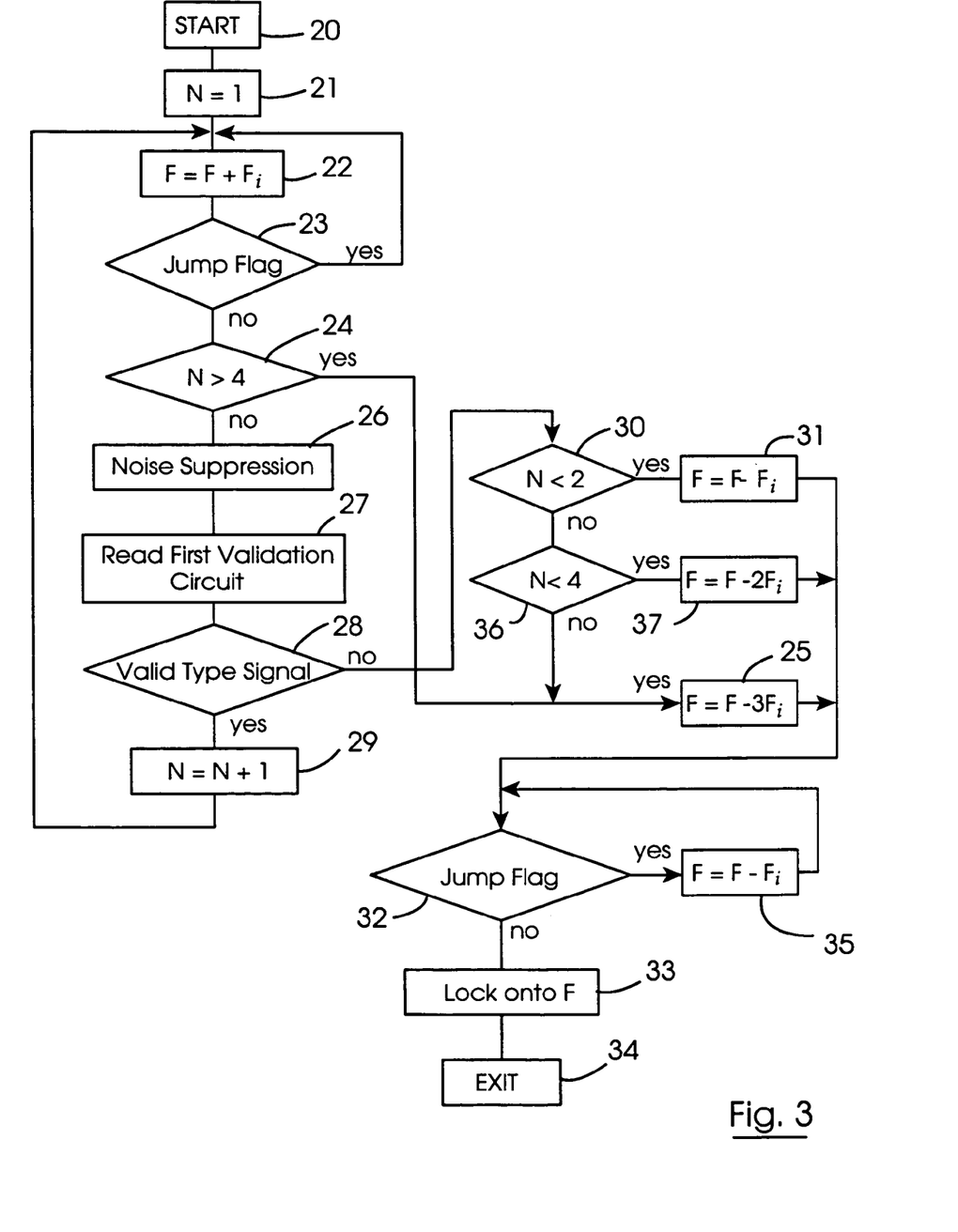
FIG. 3 is a flowchart of a software subroutine which controls the apparatus of FIG. 1.

Referring now to FIG. 3 a flowchart of a subroutine of software for controlling the microprocessor 6 for operating the tuner 3 after a valid type signal has been detected in one of the channels during a scan will now be described. For convenience the channel in which a valid type signal has first been detected will be referred to as Channel No. 0, although, it will be appreciated that Channel No. 0 may be any one of the thirty-two channels within the predetermined frequency bandwidth. The microprocessor 6 under the control of suitable software continuously or at appropriate periodic intervals operates the tuner 3 to sequentially scan the channels in frequency steps of 0.017 MHz which correspond to the bandwidth of each channel, from the lowest frequency of 433.65 MHz to the highest frequency of 434.20 MHz of the predetermined frequency bandwidth. The microprocessor 6 operates the tuner 3 to hold the receiving frequency of the receiving apparatus 1 at each frequency step for a predetermined time interval sufficient to allow the first validation circuit 10 to determine if a received signal is a valid type signal. In this embodiment of the invention the predetermined time interval is approximately 1 millisecond. On the first validation circuit 10 determining that a valid type signal has been received in a channel, the frequency of which the tuner 3 is being operated, the microprocessor 6 calls up the subroutine of FIG. 3.

Block 20 of the subroutine commences the subroutine which then moves to block 21. Block 21 sets a constant N equal to 1 for counting the channels scanned after Channel No. 0. Block 22 increments the frequency of the tuner 3 by one frequency step of 0.017 MHz, in this case by one frequency step from Channel No. 0 to the next channel up, and for this pass of the subroutine will be referred to as Channel No. 1. The subroutine then goes to block 23 which checks if a jump flag has been set for this channel, and if a jump flag has been set the subroutine is returned to block 22, and thus skips the channel for which the jump flag has been set. Otherwise, the subroutine is moved to block 24. Block 24 checks if N is greater than 4. It is expected that the received AM signal will not straddle more than five adjacent channels, and thus in this embodiment of the invention the subroutine of FIG. 3 is set to scan to a maximum of four channels after Channel No. 0. In the event that Block 24 determines that N is greater than 4, the subroutine is moved to block 25 which will be described in detail below. If block 24 determines that N is not greater than 4, in other words, that four or less channels from Channel No. 0 have been scanned, the subroutine moves to block 26 which calls up the subroutine of FIG. 4 for operating the noise suppression circuit 9 as will be described below. The subroutine then moves to block 27, which operates the first validation circuit 10 to analyse the signal to ascertain if the signal is a valid type signal.

The first validation circuit 10 sets its output high in the event that the signal is a valid type signal, and low in the event of the signal not being a valid type signal. The subroutine then moves to block 28 to determine if the signal is a valid type signal. If the output of the first validation circuit 10 is high indicating a valid type signal, the subroutine moves to block 29. Block 29 sets the constant N equal to N+1 indicating that the next channel, namely, Channel No. N+1 is next to be scanned, and returns the subroutine to block 22. Block 22 again increments the frequency at which the tuner 3 was last operating by a further frequency step of 0.017 MHz, thus causing the tuner 3 to tune to the next channel up, namely, Channel No. N+1, and the subroutine continues.

Returning now to block 28, should block 28 detect a low on the output of the first validation circuit 10 indicating that a valid type signal has not been detected in the channel to which the tuner 3 is tuned, the subroutine is moved to block 30. Block 30 checks if the value of N is less than 2, which would indicate that only one channel next to Channel No. 0 had been scanned before the signal disappeared, in other words, the signal would have disappeared in Channel No. 1. Thus, the signal would be determined as existing in one channel only, namely, Channel No. 0, see FIG. 5(*a*), which illustrates a plot of the amplitude of the received signal against frequency channels. If block 30 determines that N is less than 2 the subroutine moves to block 31 which decrements the frequency at which the tuner 3 in currently operating by one frequency step of 0.017 MHz. This, thus, returns the tuner to operate at Channel No. 0, namely, the only channel in which the valid type signal has been detected, assuming a channel had not been skipped by block 23.

The subroutine then moves to block 32 which checks if a jump flag has been set in the channel, the frequency of which has been determined by block 31. If block 32 determines that a jump flag has not been set, the subroutine moves to block 33 which locks the tuner onto the channel, the frequency of which has been determined by block 31 for the predetermined time period of 100 milliseconds so that at least one complete signal is received and gated through the gate circuit 11, and analysed by the second validation circuit 14. The subroutine then moves to block 34 which returns control of the microprocessor 36 to the software which is provided for scanning the predetermined frequency bandwidth, which continues sequential scanning of the predetermined frequency bandwidth through the thirty-two channels, until a signal is again detected. If block 32 determines that a jump flag has been set in the channel, the frequency of which is determined by block 31, the subroutine moves to block 35 which decrements the frequency by one frequency step, and returns the subroutine to block 32. The combination of blocks 32 and 35 are required due to the fact that block 23 of the subroutine skips channels in which a jump flag has been set, and thus the combination of blocks 32 and 35 compensate for block 23.

Should block 30 determine that N is not less than 2, in other words, is equal to 2 or greater, the subroutine is moved to block 36. Block 36 checks if N is less than 4 which would indicate that one or two additional channels had been scanned beyond Channel No. 0 before the signal disappeared. This, thus, would indicate that the signal straddled two or three channels, namely, Channels Nos. 0 and 1 or Channels Nos. 0, 1 and 2, see FIGS. 5(b) and 5(c), which illustrate a plot of the amplitude of the received signal against frequency channels. If block 36 determines that N is less than 4 the subroutine is moved to block 37 which decrements the frequency at which the tuner 3 is currently operating by two frequency steps, namely, by 0.034 MHz. This, thus, causes the tuner 3 to operate at two channels below the channel at which the signal disappeared. Thereby, in the case of the signal straddling three channels, namely, Channels Nos. 0, 1 and 2, the tuner 3 is operated at the frequency of the middle channel, namely, Channel No. 1, see FIG. 5(c), assuming no channels have been skipped by block 23. On the other hand, if the signal straddles two channels, namely, Channels Nos. 0 and 1 the tuner 3 is operated at the frequency of Channel No. 0, which is one of the channels adjacent the middle of the two Channels Nos. 0 and 1, see FIG. 5(b), assuming no channels have been skipped by block 23. The subroutine then moves to block 32, which has already been described, and which if a channel had been skipped by block 23, and if the skipping of the channel resulted in the channel selected by block 37 being a channel for which a jump flag is set, in combination with block 35 selects the first channel below the channel selected by block 37 for which a jump flag has not been set. Otherwise, block 32 moves the subroutine to block 33, and then to block 34.

In the event that block 36 determines that N is not less than 4, this indicates that two additional channels beyond Channel No. 2 have been scanned, namely Channels Nos. 3 and 4. This, thus, indicates that the signal straddles four or five channels, namely, Channels Nos. 0 to 3, or Channels Nos. 0 to 4, see FIGS. 5(d) and 5(e), which illustrate a plot of amplitude of the received signal against frequency channels. If block 36 determines that N is not less than 4, the subroutine is moved to block 25. Block 25 decrements the frequency at which the tuner 3 is operating by three frequency steps, namely, 0.051 MHz which causes the tuner 3 to operate in a channel which is three channels below the channel in which the signal disappeared, assuming no jump flags have been skipped by block 23. Thus, in the case of the signal straddling five channels, namely, Channels Nos. 0 to 4 the tuner is operated in the middle channel, namely, Channel No. 2, see FIG. 5. On the other hand, if the signal straddles four channels, namely, Channels Nos. 0 to 3, the tuner is operated in Channel No. 1, which is the channel adjacent to the middle of the four channels, see FIG. 5(d). The subroutine then moves onto block 32, which has already been described, and eventually through blocks 33 and 34, and depending on block 32 may also pass through block 35, and thus, block 33 locks the tuner onto the frequency channel determined by either block 25 or 35.

After block 32 has locked the tuner 3 onto the channel, the frequency of which is determined by blocks 25, 31, 35 or 37, as the case may be for the predetermined time period, until one complete signal has been gated through the gate circuit 11, and analysed by the second validation circuit 14, and validated or otherwise, the subroutine then moves to block 34 which as already described returns control of the microprocessor 6 to the software which is provided for scanning the predetermined frequency bandwidth, which continues sequential scanning of the predetermined frequency bandwidth through the thirty-two channels until a signal is again detected.

Figure 4:
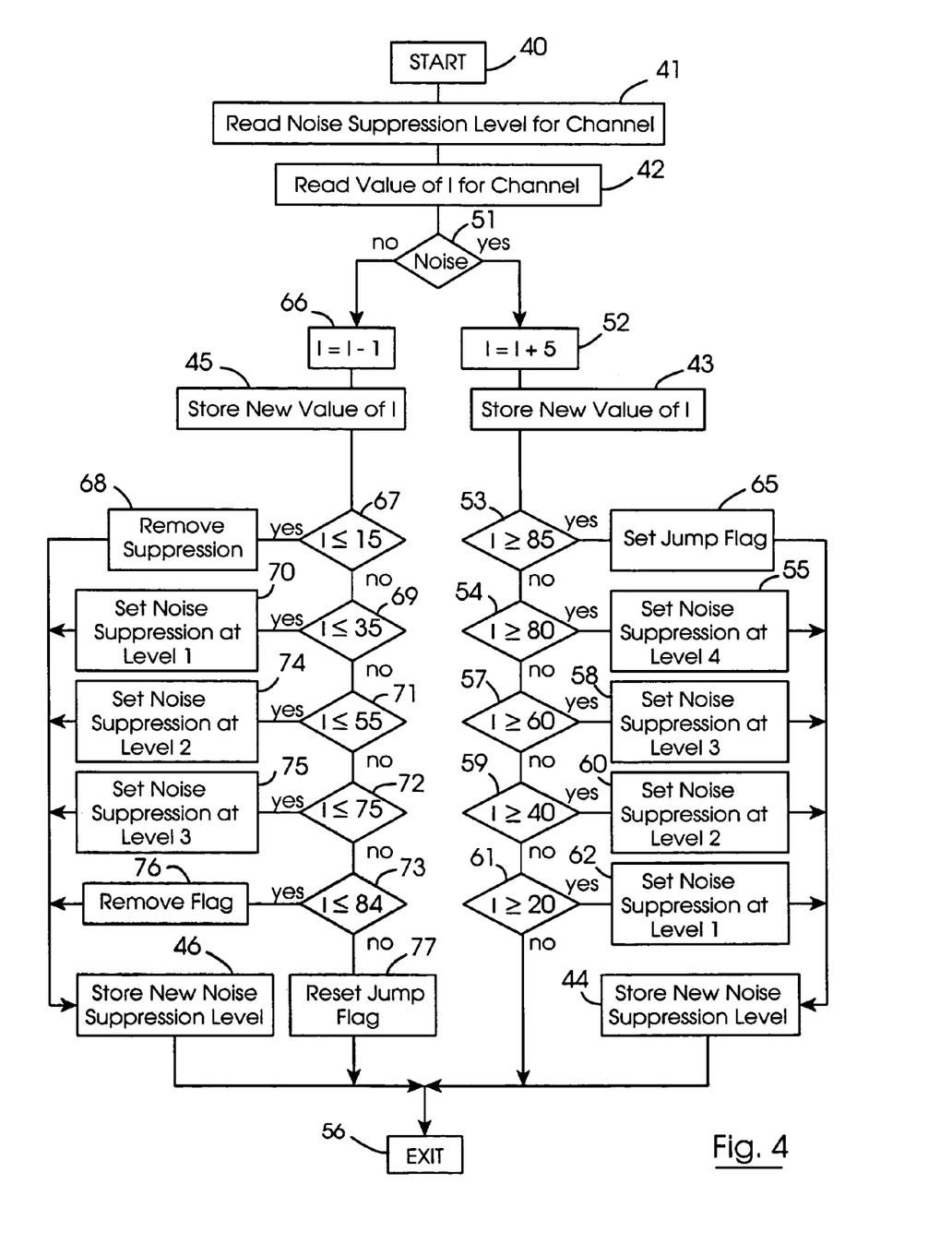
FIG. 4 is a flowchart of another software subroutine which also controls the apparatus of FIG. 1, and FIGS. 5(a) to (e) are typical waveforms of AM radio signals as received by the receiving apparatus of FIG. 1.

Turning now to FIG. 4 there is illustrated a flow chart of a subroutine of software under which the microprocessor 6 is operated for controlling the noise suppression circuit 9 for reducing the sensitivity at which the receiving apparatus 1 receives signals in the respective channels of the frequency bandwidth. This subroutine of FIG. 4 is called up by block 26 of the subroutine of FIG. 3 as each channel is being scanned. A storing means provided by a noise level register in the microprocessor 6 stores the current suppression level at which the noise suppression circuit 9 is being operated for each channel, and an integer register in the microprocessor 6 also stores the value of an integer I for each channel which will be described below.

The integer I is used for determining when the noise suppression level should be varied up or down for each channel. The integer I provides a pseudo-count of the number of scans of each channel in which noise is or is not detected by the analysing circuit 8 after the noise suppression level for that channel has been incremented or decremented. The number of counts in which noise is detected is weighted over and above the number of counts in which noise is not detected. On each scan in which noise is detected in a signal on a channel after the level of noise suppression for that channel has been altered, the integer I for that channel is incremented by a first value, which in this embodiment of the invention is 5, each time no noise is detected, the integer I is decremented by a second value, which in this embodiment of the invention is 1. When the value of the integer I is increasing and it reaches a first one of four first current integer values, which correspond to the four levels of suppression, respectively, the noise suppression circuit 9 is set to the first level of noise suppression, namely, suppression level 1. The first of the four first current values of the integer I in this embodiment of the invention is 20. On the value of the integer I reaching the second of the four first current integer values, which in this embodiment of the invention is 40, the noise suppression circuit 9 is set to the second level of noise suppression, namely, noise suppression level 2. On the value of the integer I reaching the third of the four first current integer values, which in this embodiment of the invention is 60, the noise suppression circuit 9 is set to the third level of noise suppression, namely, noise suppression level 3. On the integer I reaching the fourth of the first current integer values, which in this embodiment of the invention is 80, the noise suppression circuit 9 is set to the fourth level of noise suppression, namely, noise suppression level 4. Should noise remain in the signal after the noise suppression level has been set to the level 4 and the signal cannot be deciphered, the jump flag is set as will be described below for causing the microprocessor 6 to cause the tuner to jump that channel during each scan of the frequency bandwidth for a predetermined number of scans, which in this embodiment of the invention is 5 scans.

When the value of the integer I is reducing, and it falls to a first one of four second current integer values, which also correspond to the four levels of noise suppression, respectively, the noise suppression circuit 9 is set to the third noise suppression level, namely, level 3. In this embodiment of the invention the first one of the values of the second current integer values is 75. On the value of the integer I falling to the second value of the second current integer values, which in this embodiment of the invention is 55, the noise suppression circuit 9 is set to level 2. On the value of the integer I falling to the third of the second current integer values, which in this embodiment of the invention is 35, the noise suppression circuit 9 is set to level 1. On the value of the integer I falling to the fourth of the second current integer values, which in this embodiment of the invention is 15, the noise suppression circuit 9 is operated to remove noise suppression from that channel.

Referring now in particular to FIG. 4, block 40 starts the subroutine and the subroutine then moves to block 41. Block 41 reads the noise suppression level from the register in the microprocessor 6 at which the noise suppression circuit 9 is currently set for the channel to which the tuner 3 is tuned. The subroutine then moves to block 42 which reads the current value of the integer I from the integer register for that channel. The subroutine then moves to block 51 which reads the output of the noise analysing circuit 8, and determines if noise is present in the signal. If noise is present in the signal the subroutine moves to block 52 which increments the value of the integer I by 5. The subroutine then moves to block 43 which stores the new value of the integer I in the integer register, and moves to block 53. Block 53 checks if the value of I is greater than or equal to 85. If the value of the integer I is not greater than or equal to 85 the subroutine moves to block 54 which checks if the value of I is greater than or equal to 80. If so, the subroutine moves to block 55 which sets the suppression level of the noise suppression circuit 9 at level No. 4. The subroutine then moves to block 44 which stores the new noise suppression level in the appropriate register for that channel. The subroutine then moves to block 56 which exits from the subroutine and returns control of the microprocessor 6 to the subroutine of FIG. 3. On the other hand should block 54 determine that I is less than 80 the subroutine moves to block 57, which checks if the value of I is greater than or equal to 60. If so, the subroutine moves to block 58 which sets the level of suppression of the noise suppression circuit 9 at level No. 3, and the subroutine then moves to block 44 which has already been described. On the other hand should block 57 determine that I is less than 60, the subroutine moves to block 59 which checks if the value of I is greater than or equal to 40. If so, the subroutine moves to block 60 which sets the suppression level of the noise suppression circuit 9 to level No. 2. The subroutine then moves to block 44 which has already been described. Should block 59 determine that the value of I is less than 40 the subroutine then moves to block 61 which checks if the value of I is greater than or equal to 20. If so, the subroutine moves to block 62 which sets the suppression level of the noise suppression circuit 9 at level No. 1 and the subroutine moves to block 44. Should block 61 determine that I is less than 20 the subroutine moves to block 56.

Should block 53 determine that the value of the integer I is greater than or equal to 85 thus indicating that noise is still present in the signal after the noise suppression circuit 9 has been set at the maximum noise suppression level 4 on the last frequency bandwidth scan the subroutine moves to block 65. Block 65 sets the jump flag for that channel, thereby causing the tuner to skip that channel for the predetermined number of 5 scans of the frequency bandwidth. The subroutine then moves to block 44 which has already been described.

On the other hand, should block 51 determine that no noise can be detected in the signal the subroutine moves to block 66 which decrements the value of the integer I by 1. The subroutine then moves to block 45 which stores the new value of the integer I for that channel in the integer register, and the subroutine moves to block 67. Block 67 checks if the value of the integer I is less than or equal to 15, and if so, the subroutine moves to block 68 which causes the noise suppression circuit 9 to operate with no noise suppression on the signal. In other words, the apparatus 1 is operated at the maximum level of sensitivity for receiving the signals on that particular channel. The subroutine then moves to block 46 which stores the new value of the noise suppression level for that channel in the noise level register, and the subroutine moves to block 56 which has already been described. Should block 67 determine that the value of the integer I is not less than or equal to 15 the subroutine moves to block 69 which checks if the value of the integer I is less than or equal to 35. If so, the subroutine moves to block 70 which decreases the level of noise suppression, thereby causing the noise suppression circuit to operate at level 1, and the subroutine moves to block 46. Should block 69 determine that the value of the integer I is not less than or equal to 35, the subroutine continues to pass through blocks 71 and 72 in similar fashion to that through which the subroutine passed through the blocks 57 and 59. If block 71 determines that I is less than or equal to 55 the subroutine moves to block 74 which sets the noise level at level No. 3. If block 72 determines that I is less than or equal to 75 the subroutine moves to block 75 which sets the suppression level at level No. 3. Should the subroutine reach block 73, and block 73 determines that the value of the integer I is less than or equal to 84 the subroutine moves to block 76 which removes the jump flag, and moves the subroutine to block 46. On the other hand, should block 73 determine that the value of the integer I is not less than or equal to 84 the subroutine moves to block 77 which resets the jump flag so that this channel will continue to be jumped for a further predetermined number of scans of the frequency bandwidth, namely, 5 scans. The subroutine then moves to block 56.

By incrementing the value of the integer I by the first predetermined integer value of 5 on each scan of the channel in which noise is detected and increasing the level of suppression by one level at each of the values of the first current integer values of the integer I being equal to 20, 40, 60 and 80, and by decrementing the value of I by the second value of 1, which is less than the first integer value on each scan of the channel in which no noise is detected, and by reducing the noise suppression level by one level each time the value of the second current integer value of the integer I is reduced to 15, 35, 55 and 75 introduces a sufficient level of hysteresis into the noise suppression circuit of the apparatus 1 to avoid excessive cycling of the noise suppression circuit between adjacent levels of noise suppression.

While the method for determining the level of noise suppression to be applied to each channel has been described as being determined by the value of the integer I, other suitable means for determining the level of suppression to be applied and for determining the appropriate times at which to apply the level of suppression may be used. It is also envisaged that where the level of suppression to be applied to each channel is determined by the value of the integer I, other first and second values of the integer I, and other first and second current integer values could be used besides those described.

It will also be appreciated that other methods for determining when the jump flag is to be set may be used, and it will also be appreciated that the predetermined number of scans during which a channel, a jump flag for which has been set, may be other than five.

In certain cases, it is envisaged that a jump flag would not be set, and none of the channels would be skipped during scanning of the predetermined frequency bandwidth.

What is claimed is:

1. A method for receiving an amplitude modulated radio signal which may be transmitted in any one of a plurality of frequency channels within a predetermined frequency bandwidth, the method comprising:

operating a tuning means of a radio receiver to scan the channels of the predetermined frequency bandwidth for detecting a signal, and on a signal being detected operating the tuning means to scan a frequency bandwidth adjacent the channel in which the signal is detected for determining the number of channels in which the signal can be detected, operating the tuning means to select the frequency of a middle one of the channels in which the signal can be detected for receiving the signal, passing a received signal in each frequency channel selected by the tuning means through a variable level noise suppressing means, analysing the received signal from the noise suppressing means from each frequency channel selected by the tuning means for the presence of noise, incrementing the noise suppressing means by one level of suppression for the frequency channel selected by the tuning means on noise being detected in the analysed received signal, setting a flag means for each channel in which noise is detected in the received signal after the level of suppression at which the noise suppressing means is operated for that channel is at a predetermined maximum noise suppression level, and skipping each channel for which the flag means is set on each scan of the predetermined frequency bandwidth for a predetermined number of scans.

2. A method as claimed in claim 1 in which the tuning means is locked onto the frequency of the middle one of the channels in which the signal can be detected for a period sufficient for allowing at least one complete signal to be received.

3. A method as claimed in claim 2 in which the tuning means is locked onto the frequency of the middle one of the channels in which the signal can be detected for a predetermined time period.

4. A method as claimed in claim 1 in which the frequency bandwidths of the respective frequency channels are similar.

5. A method as claimed in claim 1 in which each time a signal is detected in a frequency channel in a scan the received signal is analysed for determining if the signal is of a valid type.

6. A method as claimed in claim 1 in which the tuning means is operated for scanning the frequency channels within the predetermined frequency bandwidth sequentially from one end of the predetermined bandwidth to the other.

7. A method as claimed in claim 6 in which the tuning means is operated for scanning the predetermined frequency bandwidth by sequentially altering the scanned frequency in frequency steps.

8. A method as claimed in claim 1 in which on detecting a signal in one of the frequency channels, the tuning means is operated to sequentially scan the channels from the channel in which the signal is first detected until a channel in which the signal can no longer be detected has been reached for determining the middle one of the channels in which the signal can be detected.

9. A method as claimed in claim 8 in which a count is recorded of the number of frequency channels through which the tuning means is stepped from the channel in which the signal is first detected to the channel in which the signal can no longer be detected has been reached for determining the middle one of the channels in which the signal can be detected.

10. A method as claimed in claim 9 in which the number of frequency steps through which the tuning means is stepped after the channel in which the signal is first detected is limited to a predetermined number of steps.

11. A method as claimed in claim 8 in which when the channel in which the signal can no longer be detected has been reached or the tuning means has been stepped through the predetermined number of steps from the channel in which the signal is first detected, the frequency at which the tuning means 9 is operating is altered by approximately half the number of frequency steps through which the tuning means had been operated from the channel in which the signal is first detected.

12. A method as claimed in claim 1 in which, on no noise being present in the signal from the noise suppressing means on the channel to which the tuning means is tuned, the suppression level at which the noise suppressing means is being operated is decremented by one suppression level for that channel until the suppression level at which the noise suppressing means is being operated for that channel is reduced to a zero level of suppression.

13. A receiving apparatus for receiving an amplitude modulated radio signal which may be transmitted in any one of a plurality of frequency channels within a predetermined frequency bandwidth, the apparatus comprising:

a receiving means for receiving the radio signal, a tuning means for sequentially tuning the receiving means to the plurality of frequency channels, a detecting means for detecting the presence of a signal, a control means for controlling the tuning means for sequentially scanning the channels of the predetermined frequency bandwidth, the control means being responsive to the detecting means detecting a signal in one of the frequency channels for controlling the tuning means to scan a frequency bandwidth adjacent the frequency channel in which the signal is detected for determining the number of channels in which the signal can be detected, and for further operating the tuning means to select a middle one of the channels in which the signal can be detected, a variable level noise suppressing means operable under the control of the control means for suppressing noise in the received signal on each selected frequency channel, and a noise analysing means for analysing the received signal on each selected channel for noise after the received signal has been passed through the noise suppressing means, the control means being responsive to noise being detected in the received signal of a selected channel by the noise analysing means for incrementing the level of suppression at which the noise suppressing means is being operated by one level of suppression for that channel, and for setting a flag means for each channel for which noise is still present in the received signal after the noise suppressing means is operated at a maximum predetermined noise suppression level for that channel, and the control means is responsive to the flag means being set for operating the tuning means to skip each channel for which the flag means has been set for a predetermined number of scans.

14. Apparatus as claimed in claim 13 in which the control means locks the tuning means onto the frequency of the middle one of the channels in which the signal can be detected for a period sufficient for allowing at least one complete signal to be received.

15. Apparatus as claimed in claim 13 in which a first signal analysing means is provided for analysing each received signal for determining if the signal is of a valid type.

16. Apparatus as claimed in claim 13 in which the control means operates the tuning means for scanning the frequency channels of the predetermined frequency bandwidth sequentially from one end of the predetermined bandwidth to the other.

17. Apparatus as claimed in claim 13 in which the control means operates the tuning means for scanning the predetermined frequency bandwidth by sequentially altering the scanned frequency in respective frequency steps.

18. Apparatus as claimed in claim 13 in which the control means is responsive to the detecting means detecting a signal in one of the channels for operating the tuning means to sequentially son the channels from the channel in which the signal is first detected until a channel in which the signal can no longer be detected has been reached for determining the middle one of the channels in which the signal can he detected.

19. Apparatus as claimed in claim 13 in which the control means stores a count of the number of channels through which the tuning means is stepped from the first channel in which a signal is detected to the channel in which the signal can no longer be detected has been reached.

20. Apparatus as claimed in claim 19 in which the control means is responsive to the count of the number of channels in which the signal can be detected exceeding a predetermined number or to the channel in which the signal can no longer be detected being reached for altering the frequency at which the tuning means is operating to a frequency which is at least one frequency step towards the channel in which the signal is first detected for determining the middle one of the channels in which the signal can be detected.

21. Apparatus as claimed in claim 13 in which the control means is responsive to the noise analysing means failing to detect noise in the signal from a channel to which the tuning means is tuned for reducing the level of suppression to which the noise suppressing means is set for that channel by one level to a minimum of zero level of suppression.

22. Apparatus as claimed in claim 13 in which a gate means is provided which is responsive to a valid type signal being detected for gating the valid type signal from the apparatus.

23. Security apparatus for a motor vehicle the security apparatus comprising the receiving apparatus as claimed in claim 13, and a second analysing means for analysing each valid type signal gated from the receiving apparatus for determining if the valid type signal is a valid signal for the security apparatus.

24. Apparatus as claimed in claim 13 in which a storing means is provided for storing the level of suppression at which the noise suppressing means is being operated for each channel.

\* \* \* \* \*